United States Patent
Maeda et al.

(10) Patent No.: US 8,785,329 B2
(45) Date of Patent: Jul. 22, 2014

(54) METHOD FOR FORMING PATTERN AND METHOD FOR MANUFACTURING SEMICONDUCTOR DEVICE

(71) Applicants: Shimon Maeda, Tokyo (JP); Kenji Konomi, Tokyo (JP)

(72) Inventors: Shimon Maeda, Tokyo (JP); Kenji Konomi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/728,495

(22) Filed: Dec. 27, 2012

(65) Prior Publication Data

US 2014/0073141 A1 Mar. 13, 2014

(30) Foreign Application Priority Data

Sep. 7, 2012 (JP) ................. 2012-197782

(51) Int. Cl.
*H01L 21/00* (2006.01)
(52) U.S. Cl.
USPC .......................... 438/703; 438/780
(58) Field of Classification Search
USPC .................. 438/700–703, 780–781
See application file for complete search history.

(56) References Cited

U.S. PATENT DOCUMENTS

| | | |
|---|---|---|
| 7,931,819 B2 | 4/2011 | Kihara et al. |
| 7,964,107 B2 | 6/2011 | Millward |
| 8,053,163 B2 | 11/2011 | Yi et al. |
| 8,114,306 B2 | 2/2012 | Cheng et al. |
| 2008/0093743 A1 | 4/2008 | Yang et al. |
| 2008/0182402 A1 | 7/2008 | Li et al. |
| 2009/0179002 A1 | 7/2009 | Cheng et al. |
| 2010/0294740 A1 | 11/2010 | Cheng et al. |
| 2011/0117744 A1 | 5/2011 | Ito |

FOREIGN PATENT DOCUMENTS

| | | |
|---|---|---|
| JP | 2008-043873 | 2/2008 |
| JP | 2009-147331 | 7/2009 |
| JP | 2010-522643 | 7/2010 |
| JP | 2010-269304 | 12/2010 |
| JP | 2011-129874 | 6/2011 |

*Primary Examiner* — Richard Booth
(74) *Attorney, Agent, or Firm* — Finnegan, Henderson, Farabow, Garrett & Dunner, L.L.P.

(57) ABSTRACT

In a method for forming a pattern according to an embodiment, a first guide pattern and a second guide pattern for induced self organization of a DSA material are formed on substrate. On a first DSA condition, a first phase-separated pattern having regularity with respect to the first guide pattern is formed, and a first pattern is formed by processing the lower layer side. Subsequently, on a second DSA condition, a second phase-separated pattern having regularity with respect to the second guide pattern is formed, and a second pattern is formed by processing the lower layer side.

20 Claims, 7 Drawing Sheets

METHOD FOR FORMING PATTERN AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2012-197782, filed on Sep. 7, 2012; the entire contents of which are incorporated herein by reference.

FIELD

Embodiments described herein relate generally to a method for forming a pattern and a method for manufacturing a semiconductor device.

BACKGROUND

As a candidate of a next-generation lithography process, a Directed Self Assembly (DSA) process has recently been attracting attention. A DSA process is a process of forming DSA patterns by induced self organization of a DSA material.

In such a DSA process, when the size, shape or pitch of a patterning target is not constant, it has been difficult to perform patterning with a small number of processes. For this reason, it is desired to form patterns on a substrate according to DSA patterns, of which the sizes or the like are different, with a small number of processes.

DETAILED DESCRIPTION

According to an embodiment, a method for forming a pattern is provided. In the method for forming the pattern, a first guide pattern having a first dimension and a second guide pattern having a second dimension for induced self organization of a DSA material are formed on a processing target film above a substrate. A first phase-separated pattern is formed at a position corresponding to the first guide pattern on a first DSA condition that is capable of forming the first phase-separated pattern having regularity with respect to the first guide pattern and is incapable of forming a second phase-separated pattern having regularity with respect to the second guide pattern. Furthermore, a first on-substrate pattern is formed by processing the processing target film, which is disposed under the first phase-separated pattern, by using the first phase-separated pattern. Subsequently, a second phase-separated pattern is formed at a position corresponding to the second guide pattern on a second DSA condition that is capable of forming the second phase-separated pattern having regularity with respect to the second guide pattern and is incapable of forming the first phase-separated pattern having regularity with respect to the first guide pattern. Furthermore, a second on-substrate pattern is formed by processing the processing target film, which is disposed under the second phase-separated pattern, by using the second phase-separated pattern.

Exemplary embodiments of a method for forming a pattern and a method for manufacturing a semiconductor device will be explained below in detail with reference to the accompanying drawings. The present invention is not limited to the following embodiments.

Embodiments

A Directed Self Assembly (DSA) process is a process of forming DSA patterns (phase-separated patterns) by forming guide patterns (induction patterns) and then induced-self-organizing (phase-separating) a DSA material on the guide patterns or between the guide patterns (guide regions).

The following description will be given of a case where a guide pattern is a physical guide, and a DSA pattern is formed in a guide region surrounded by the sidewall surface of the guide pattern. Also, regarding the shape of the guide region or the guide pattern, the shape when viewing the guide region or the guide pattern from above the top surface will be described. Also, the guide pattern may be a chemical guide. Also, the top surface of the guide pattern may have a line shape, or may have a hole shape.

When the guide pattern has a line shape, the guide region has a line shape. When the guide region has a line shape, a DSA pattern formed within the guide region has a pattern shape with a line shape.

Also, when the guide pattern has a ring shape, the guide region has a hole shape. When the guide region has a hole shape, a DSA pattern formed within the guide region has a hole shape.

In the embodiment, a case where a cross-sectional shape of the DSA pattern is a concave pattern (pattern surrounded by a sidewall surface and a bottom surface of a groove) will be described. Also, the cross-sectional shape of the DSA pattern may be a convex pattern.

Figure 1A:
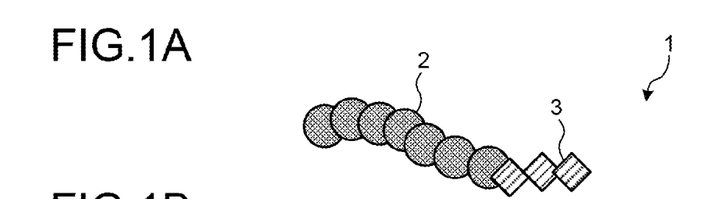
FIGS. 1A to 1C are diagrams illustrating constitution examples of DSA materials.
Figure 1B:
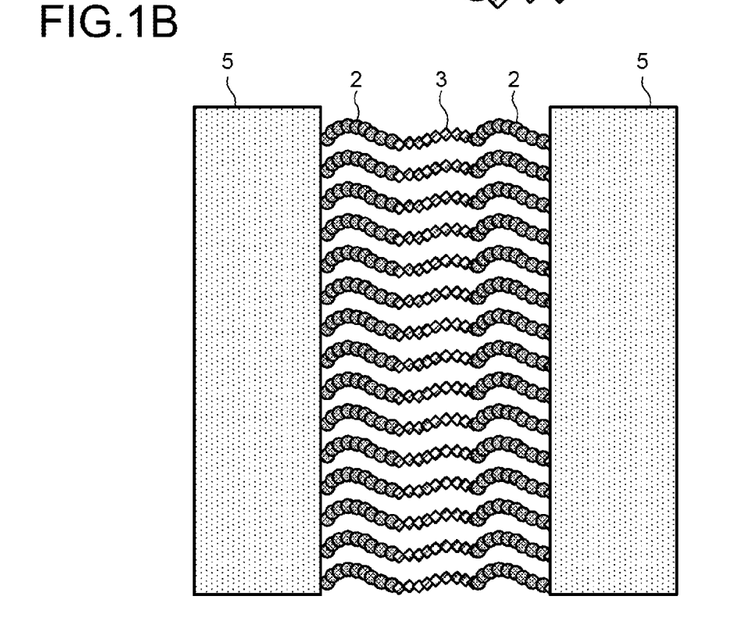
Figure 1C:
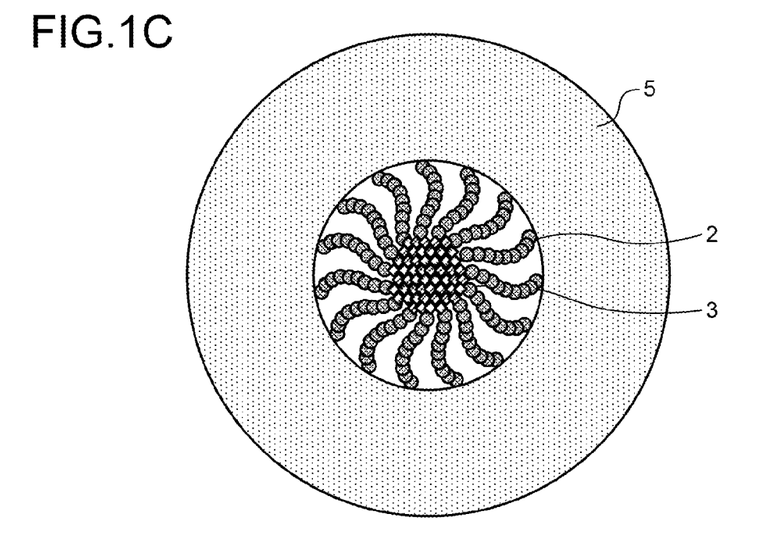

FIGS. 1A to 1C are diagrams illustrating constitution examples of DSA materials. FIG. 1A schematically illustrates a top view of a DSA material (DSA molecule) 1. Also, FIG. 1B schematically illustrates a constitution of the DSA material 1 that is induced-self-organized when a guide pattern has a line shape. Also, FIG. 1C schematically illustrates a constitution of the DSA material 1 that is induced-self-organized when a guide pattern has a ring shape. As illustrated in FIG. 1A, the DSA material (induced-self-organized material) 1 is a polymer (high molecular block copolymer) having a hydrophilic portion 3 and a lipophilic portion (hydrophobic portion) 2.

As illustrated in FIG. 1F or 1C, for example, when the DSA material 1 is coated on the guide pattern 5 formed of a hydrophilic material, the lipophilic portion 2 aggregates around the guide pattern 5. Also, the DSA materials 1 are bonded such that the hydrophilic portion 3 and the lipophilic portion 2 are alternately connected. Therefore, the DSA materials 1 are linearly bonded between the guide patterns 5 in the order of the lipophilic portion 2, the hydrophilic portion 3, and the lipophilic portion 2. A pattern, in which the hydrophilic portion 3 is removed from the linearly bonded pattern, is a DSA pattern. Also, a pattern, in which the lipophilic portion 2 is removed from the linearly bonded pattern, may be a DSA pattern.

In the embodiment, a plurality of types of DSA patterns, which are different in at least one of size, shape, and pitch, are formed using a plurality of types of DSA materials. Also, when the guide pattern is a physical guide formed of a lipophilic material, the hydrophilic portion 3 aggregates around the guide pattern 5.

Also, when the guide pattern is a chemical guide formed of a hydrophilic material, the lipophilic portion 2 aggregates on the guide pattern. Also, when the guide pattern is a chemical guide formed of a lipophilic material, the hydrophilic portion 3 aggregates on the guide pattern.

FIGS. 2A to 2D are diagrams for describing a DSA process when the guide region has a line shape. FIGS. 3A to 3D are diagrams for describing a DSA process when the guide region has a hole shape.

Figure 2A:
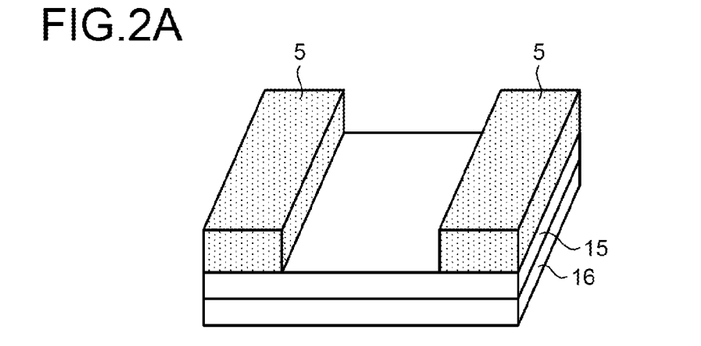
FIGS. 2A to 2D are diagrams for describing a DSA process when a guide region has a line shape.
Figure 3A:
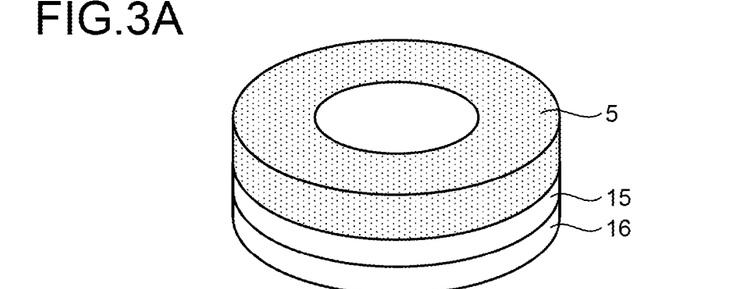
FIGS. 3A to 3D are diagrams for describing a DSA process when a guide region has a hole shape.

As illustrated in FIG. 2A or 3A, a processing target film 15 is formed on a wafer (substrate) 16, and guide patterns 5 are formed on the processing target film 15. The guide patterns 5 are formed using, for example, electron beam (EB) lithography or the like. Specifically, after coating a guide material on an entire surface of the processing target film 15, a resist is coated on an entire surface of the guide material. The guide material may be neutral, lipophilic, or hydrophilic. Herein, a case where the guide material is hydrophilic will be described.

After coating the resist, a predetermined region on the resist is exposed by EB exposure to form a resist pattern. By etching the guide material from above the resist pattern, the guide material is patterned. Subsequently, the resist pattern is removed from above the guide patterns 5. Therefore, the guide patterns 5 patterned in the guide material are formed.

Figure 2B:
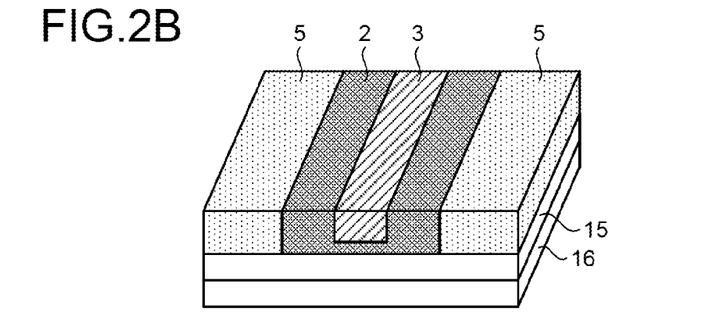
Figure 3B:
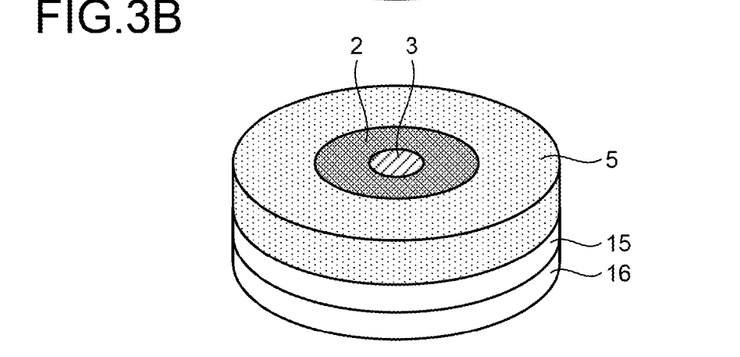

Subsequently, a DSA material 1 is coated on the top surfaces of the guide patterns 5. Therefore, a lipophilic portion 2 and a hydrophilic potion 3, which are block chains of the DSA material 1, start to move and, as illustrated in FIG. 2B or 3B, the lipophilic portion 2 aggregates around the guide patterns 5. In this manner, the lipophilic portion 2, which is one block chain of the DSA material 1, is segregated within the guide patterns 5, and the block chain is microphase-separated. As a result, the DSA material 1, which is linearly bonded in the order of the lipophilic portion 2, the hydrophilic portion 3, and the lipophilic portion 2, aggregates between the guide patterns 5. Also, the number of repetitions of the bonding between the lipophilic portion 2 and the hydrophilic portion 3 is determined by the distance between the guide patterns 5 and the length of the DSA material 1.

Figure 2C:
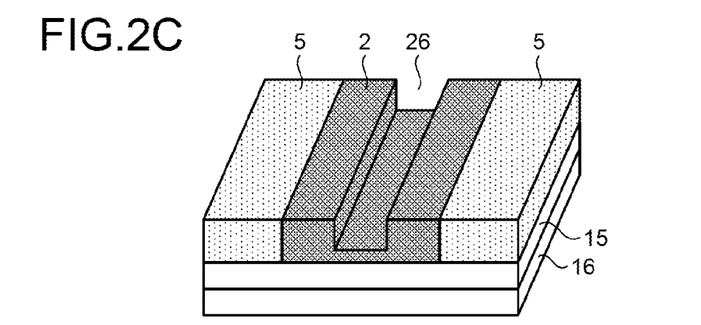
Figure 3C:
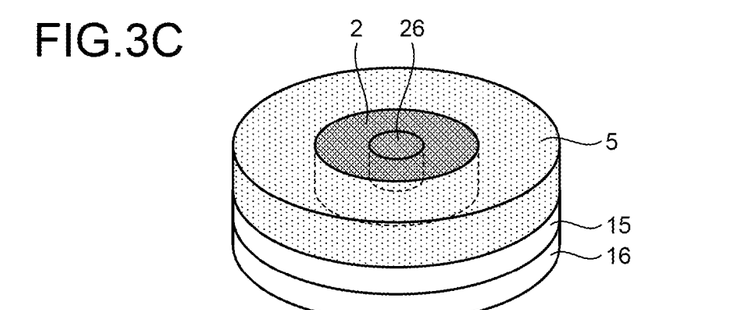

After the DSA material 1 is coated on the top surface of the processing target film 15 and the DSA material 1 is phase-separated, the hydrophilic portion 3 of the DSA material 1 is removed by processing, such as DSA development or etching. Therefore, as illustrated in FIG. 2C or 3C, the lipophilic portion 2 remains between the guide patterns 5. A region, from which the hydrophilic portion 3 is removed, becomes a DSA pattern 26. In other words, a space pattern formed by the lipophilic portion 2 is the DSA pattern 26.

Furthermore, the hydrophilic portion 3 (DSA pattern 26), the lipophilic portion 2 directly below the hydrophilic portion 3, and the processing target film 15 directly below the lipophilic portion 2 are removed by etching. On the other hand, when viewing the wafer 16 from above the top surface, a region, in which the hydrophilic portion 3 is not disposed, remains without being removed by DSA development or the like. Therefore, the processing target film 15, which is located directly below the remaining region, also remains.

Figure 2D:
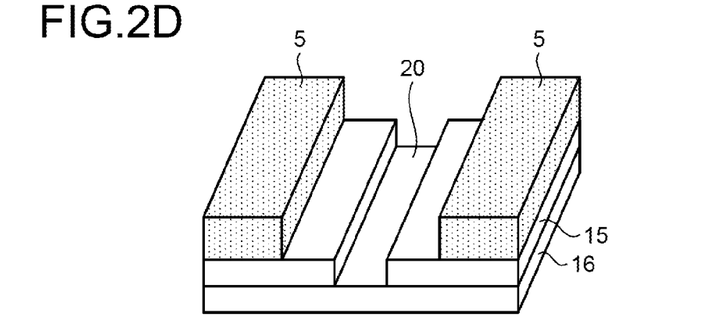
Figure 3D:
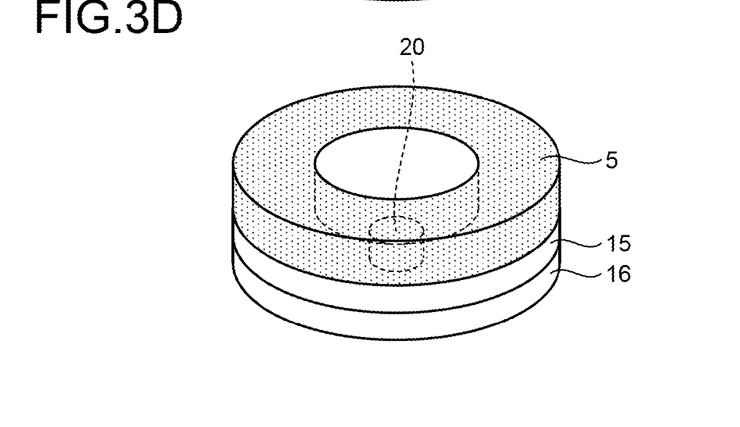

Therefore, as illustrated in FIG. 2D or 3D, an on-substrate pattern 20 corresponding to the DSA pattern 26 (hydrophilic portion 3) is formed in a central portion between the guide pattern 5 and the guide pattern 5. In other words, the on-substrate pattern 20 is patterned at a constant pitch along the guide patterns 5. After the on-substrate pattern 20 is formed, the guide patterns 5 are removed.

Figure 4A:
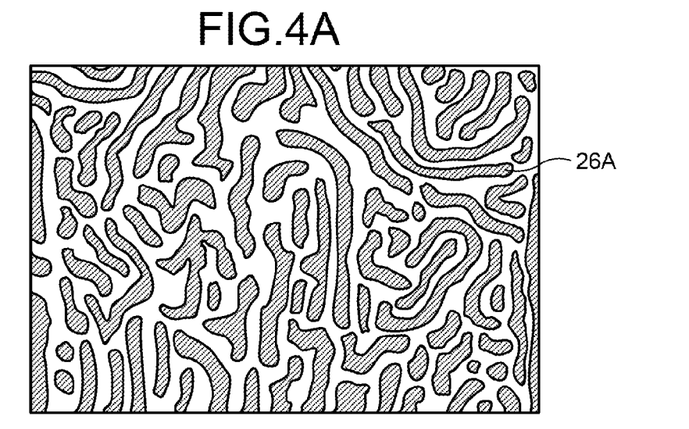
FIGS. 4A to 4C are diagrams illustrating formation examples of DSA patterns.
Figure 4B:
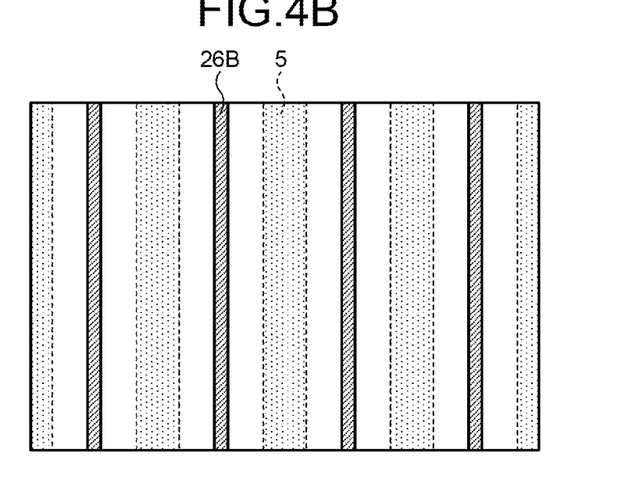
Figure 4C:
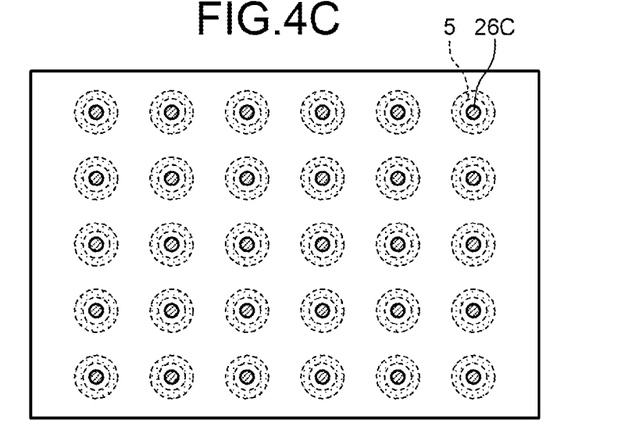

FIGS. 4A to 4C are diagrams illustrating formation examples of the DSA patterns. FIGS. 4A to 4C are top views of the DSA patterns. FIG. 4A illustrates DSA patterns 26A that are formed when the DSA material 1 is inappropriate for the guide patterns. FIG. 4B illustrates DSA patterns 26B that are formed when the DSA material 1 is appropriate for the line-shaped guide patterns 5. Also, FIG. 4C illustrates DSA patterns 26C that are formed when the DSA material 1 is appropriate for the hole-shaped guide patterns 5.

As illustrated in FIG. 4A, the DSA patterns 26A, which are formed when the DSA material 1 is inappropriate, have a substantially constant pattern width and a subsequently constant space width, but the pattern shape thereof is random and irregular. The arrangement of the DSA patterns 26A is different according to the depth of the DSA material 1. Also, the hydrophilic portion 3 may be distributed only around the top surface of the DSA material 1, and the hydrophilic portion 3 may not be distributed around the bottom surface of the DSA material 1. For this reason, even when etching is performed from above the DSA pattern 26A, the processing target film 15, which is disposed below the region where the DSA pattern 26A is formed, is not removed by the etching.

On the other hand, as illustrated in FIG. 4B, the DSA patterns 26B, which are formed when the DSA material 1 is appropriate, have a line shape. The DSA patterns 26B have a substantially constant space pattern width, and are formed at a substantially constant pitch.

Also, as illustrated in FIG. 40, the DSA patterns 260, which are formed when the DSA material 1 is appropriate, have a hole shape. The DSA patterns 26C have a substantially constant inner diameter dimension.

Also, the size of the DSA patterns 26A to 26C is determined by DSA conditions (the type of the DSA material 1 or the shape of the guide patterns), which are to be described later. In the embodiment, after forming the guide patterns, for example, a first DSA pattern is formed on a first DSA condition, and a second DSA pattern is formed on a second DSA condition.

FIGS. 5A to 5D are diagrams for describing a processing procedure of a DSA process according to an embodiment. A cross-sectional configuration of the wafer 16 is illustrated in FIGS. 5A to 5D. Herein, a double patterning method for forming two types of DSA patterns by using a DSA material 1X and a DSA material 1Y as the DSA material 1 will be described. Also, in FIGS. 5A to 5D, the DSA material 1X is illustrated as a lipophilic portion 2X and a hydrophilic portion 3X. Likewise, in FIGS. 5A to 5D, the DSA material 1Y is illustrated as a lipophilic portion 2Y and a hydrophilic portion 3Y.

Figure 5A:
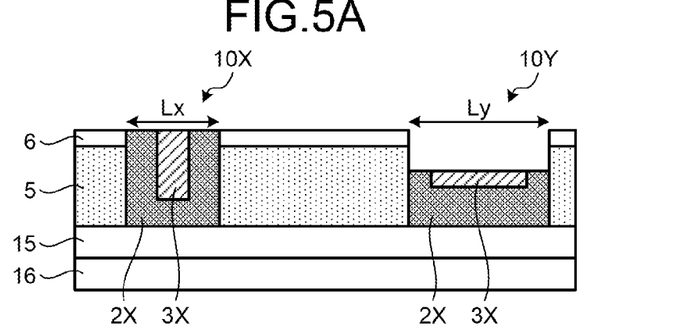
FIGS. 5A to 5D are diagrams for describing a processing procedure of a DSA process according to an embodiment.

After Tetra Ethyl Ortho Silicate (TEOS) or the like, which is not illustrated, is formed on the wafer 16, the processing target film 15 such as amorphous silicon (aSi) or the like is formed on the TEOS. A guide material (such as a hard mask material or a resist), which is to be a guide pattern 5) is formed on the processing target film 15, and furthermore, a cover film, which is to be a cover pattern 6, is formed on the guide material.

The cover film is a film other than amorphous silicon. When etching the processing target film 15, a member having a lower etching rate than the processing target film 15, the lipophilic portion 2X, and the hydrophilic portion 3X is used.

A resist film is formed on an upper layer of the cover film. Resist patterns are formed on the cover film by transferring patterns on the resist film using a lithography technique or the like and developing the resist film.

In this case, at least a space pattern having a first dimension Lx (first resist space pattern) and a space pattern having a second dimension Ly (second resist space pattern) are formed on the cover film. The shape of the first resist space pattern corresponds to the shape of the guide region 10X that is the first guide region. Also, the shape of the second resist space pattern corresponds to the shape of the guide region 10Y that is the second guide region. In other words, the shape of the resist pattern obtained by development corresponds to the shape of the guide pattern 5. Herein, the case where the width of the guide region 10X is the first dimension Lx and the width of the guide region 10Y is the second dimension Ly will be described.

The guide region 10X is a region that forms a first DSA pattern and a first on-substrate pattern (first on-substrate pattern 20X which is to be described later), and the guide region 10Y is a region that forms a second DSA pattern and a second on-substrate pattern (second on-substrate pattern 20Y which is to be described later).

In the embodiment, the first DSA pattern is formed within the guide region 10X by using the first DSA condition, and the first on-substrate pattern 20X is formed in a lower layer side of the first DSA pattern. Also, the second DSA pattern is formed within the guide region 10Y by using the second DSA condition, and the second on-substrate pattern 20Y is formed a lower layer side of the second DSA pattern.

The DSA condition, for example, includes at least one of the following conditions (1) to (13).

1) Type of DSA material 1
2) Molecular weight of DSA material 1
3) Composition ratio of DSA material 1
4) Type of lipophilic portion 2
5) Type of hydrophilic portion 3
6) $\chi$ parameter of DSA material 1
7) Coating condition of DSA material 1
8) Type (molecular weight or the like) of solvent used when coating DSA material 1
9) Guide condition (size, height or taper angle of guide pattern)
10) Annealing condition of DSA material 1 (time, temperature or atmosphere until phase separation)
11) Type of homopolymer to be added to DSA material 1
12) Molecular weight of homopolymer to be added to DSA material 1
13) Ratio of segment lengths between lipophilic portion 2 and hydrophilic portion 3

The type of the DSA material 1 is a type of polymer or the like. As the DSA material 1, polymethyl methacrylate resin (PMMA) or polystyrene (PS), and the like is used. Also, the composition ratio of the DSA material 1 is a composition ratio between the lipophilic portion 2 of the first segment and the hydrophilic portion 3 of the second segment.

By etching the cover film and the guide material from above the resist patterns obtained by the development, the cover film becomes cover patterns 6, and the guide material becomes guide patterns 5. Therefore, the guide patterns and the guide regions 10X and 10Y are formed on the processing target film 15.

Subsequently, the first DSA pattern is formed on the first DSA condition that is the DSA condition appropriate for the guide region 10X. Furthermore, the second DSA pattern is formed by the second DSA condition that is the DSA condition appropriate for the guide region 10Y. The first DSA condition and the second DSA condition are different in at least one of the above-described conditions (1) to (13).

In this case, the first DSA condition is set to a condition that is appropriate for the guide region 10X and is inappropriate for the guide region 10Y. Likewise, the second DSA condition is set to a condition that is appropriate for the guide region 10Y and is inappropriate for the guide region 10X. In other words, the first DSA condition is a condition that is capable of forming the first on-substrate pattern 20X in a lower layer side of the guide region 10X and is incapable of forming the on-substrate pattern in a lower layer side of the guide region 10Y. Likewise, the second DSA condition is a condition that is capable of forming the second on-substrate pattern 20Y in a lower layer side of the guide region 10Y and is incapable of forming the on-substrate pattern in a lower layer side of the guide region 10X.

When forming the first DSA pattern, the lipophilic portion 2X and the hydrophilic portion 3X as the DSA material 1X are coated on the wafer 16. Therefore, the lipophilic portion 2X and the hydrophilic portion 3X are buried within the guide regions 10X and 10Y.

It is assumed that the DSA material 1X satisfies the first DSA condition. In other words, it is assumed that the DSA material 1X is a material that is appropriate for the guide region 10X and is inappropriate for the guide region 10Y. In this case, as the wafer 16 is annealed, the DSA material 1X of the guide region 10X is appropriately phase-separated. Therefore, the DSA material 1X becomes an unstable state in which the DSA material 1 is phase-separated to be transferable on the guide region 10X and is nontransferable on the guide region 10Y (FIG. 5A).

After the DSA material 1X is appropriately phase-separated, the wafer 16 is DSA-developed. Therefore, the hydrophilic portion 3X within the guide region 10X is removed. Therefore, the first DSA pattern is formed within the guide region 10X. For example, when the DSA material 1X is constituted using PS and PMMA, the PMMA is removed from the inside of the guide region 10X. In this case, the PS remains within the guide region 10X, and the first DSA pattern is formed by the PS. On the other hand, in the inside of the guide region 10Y, the PS and the PMMA remain mixed as they are.

Figure 5B:
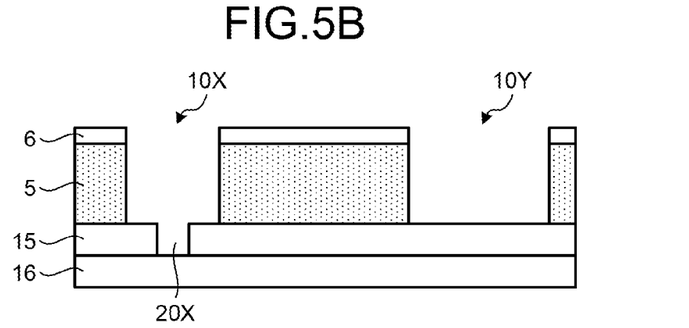

After the first DSA pattern is formed, the processing target film 15 disposed in the lower layer side of the guide region 10X is etched so that the first on-substrate pattern 20X is formed in the processing target film 15. On the other hand, in the inside of the guide region 10Y, since the lipophilic portion 2Y and the hydrophilic portion 3Y remain mixed as they are, the lower layer side disposed lower than the guide region 10Y is not processed by etching (FIG. 5B). After the first on-substrate pattern 20X is formed, the lipophilic portion 2X is removed.

Subsequently, when forming the second DSA pattern, the lipophilic portion 2Y and the hydrophilic portion 3Y as the DSA material 1Y are coated on the wafer 16. Therefore, the lipophilic portion 2Y and the hydrophilic portion 3Y are buried within the guide region 10X and 10Y.

Figure 5C:
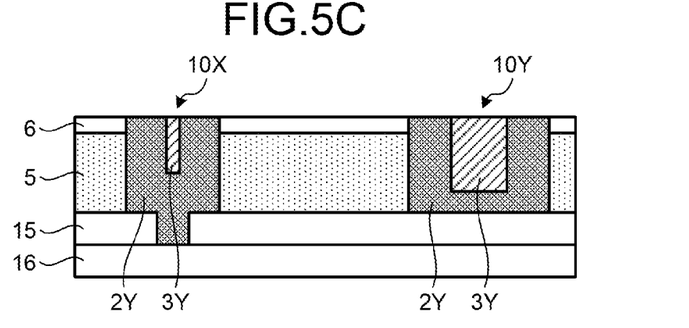

It is assumed that the DSA material 1Y satisfies the second DSA condition. In other words, it is assumed that the DSA material 1Y is a material that is appropriate for the guide region 10Y and is inappropriate for the guide region 10X. In this case, as the wafer 16 is annealed, the DSA material 1Y of the guide region 10Y is appropriately phase-separated. Therefore, the DSA material 1Y becomes an unstable state in which the DSA material 1 is phase-separated to be transferable on the guide region 10Y and is nontransferable on the guide region 10X (FIG. 5C).

After the DSA material 1Y is appropriately phase-separated, the wafer 16 is DSA-developed. Therefore, the hydrophilic portion 3Y within the guide region 10Y is removed. Therefore, the second DSA pattern is formed within the guide region 10Y.

Figure 5D:
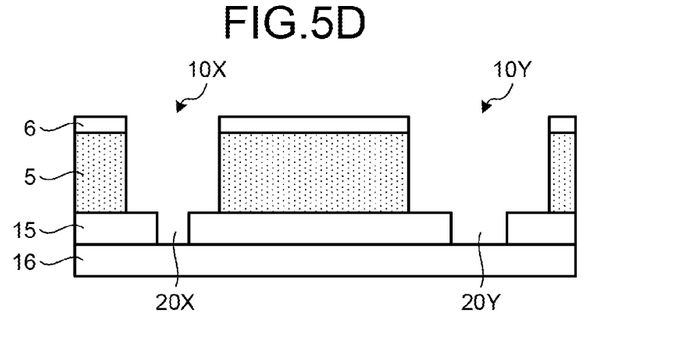

After the second DSA pattern is formed, the processing target film 15 disposed in the lower layer side of the guide region 10Y is etched so that the second on-substrate pattern 20Y is formed in the processing target film 15. On the other hand, in the inside of the guide region 10X, since the lipophilic portion 2Y and the hydrophilic portion 3Y remain mixed as they are, the lower layer side disposed lower than the guide region 10X is not processed by etching (FIG. 5D). After the second on-substrate pattern 20Y is formed, the lipophilic portion 2Y is removed.

As described above, since the first on-substrate pattern 20X and the second on-substrate pattern 20Y are formed by the two types of the DSA conditions, two different types of the on-substrate patterns 20X and 20Y having different sizes, shapes or pitches can be formed.

Figure 6:
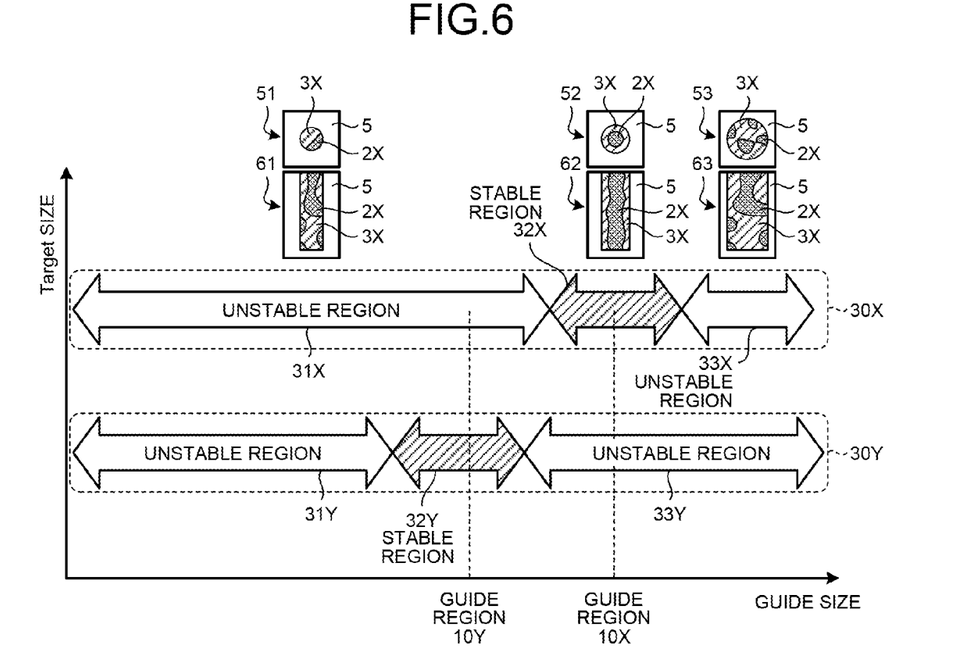
FIG. 6 is a diagram for describing conditions that are applicable as DSA conditions.

Herein, conditions that are applicable as the DSA conditions will be described. FIG. 6 is a diagram for describing conditions that are applicable as DSA conditions. In FIG. 6, a horizontal axis is a guide size (guide shape or guide pitch, and the like), and a vertical axis is a target size (target pitch, and the like). The guide size as used herein is a dimension between the guide patterns 5. Also, the target size as used herein is a size of an on-substrate pattern that is wanted to be formed. The target size and the guide size have a correspondence relation.

FIG. 6 illustrates a case where a characteristic of the DSA material 1X is a characteristic 30X, and a characteristic of the DSA material 1Y is a characteristic 30Y. The characteristics 30X and 30Y represent whether or not the DSA patterns can be stably formed with respect to the respective guide regions 10X and 10Y. Also, in FIG. 6, distributions when viewing the lipophilic portion 2 and the hydrophilic portion 3 in a top surface direction are represented by pattern distributions 51 to 53, and distributions when viewing the lipophilic portion 2 and the hydrophilic portion 3 in a cross-sectional direction are represented by pattern distributions 61 to 63.

In the case of using the DSA material 1X, when the guide size is smaller than a predetermined value (first size), the characteristic 30X becomes an unstable region 31X that cannot form DSA patterns having regularity. Distributions of the lipophilic portion 2X and the hydrophilic portion 3X in the unstable region 31X are the distributions 51 and 61. As illustrated in the distributions 51 and 61, the lipophilic portion 2X and the hydrophilic portion 3X distributed inside the guide pattern 5 have no regularity in distribution.

Also, when the guide size is larger than a predetermined value (second size), the characteristic 30X becomes an unstable region 33X that cannot form DSA patterns having regularity. Distributions of the lipophilic portion 2X and the hydrophilic portion 3X in the unstable region 33X are the distributions 53 and 63. As illustrated in the distributions 53 and 63, the lipophilic portion 2X and the hydrophilic portion 3X distributed inside the guide pattern 5 have no regularity in distribution.

On the other hand, when the guide size is in a predetermined range (from the first size to the second size), the characteristic 30X becomes a stable region 32X that can stably form DSA patterns. Distributions of the lipophilic portion 2X and the hydrophilic portion 3X in the stable region 32X are the distributions 52 and 62. As illustrated in the distributions 52 and 62, the lipophilic portion 2X and the hydrophilic portion 3X distributed inside the guide pattern 5 are phase-separated, and the lipophilic portion 2X, which is to be the DSA pattern, is disposed up to the bottom.

Therefore, since the DSA material 1X is used in the stable region 32X, the DSA patterns having regularity can be stably formed. By performing etching from above the DSA patterns having regularity, the first on-substrate pattern 20X can be formed. Also, since the DSA material 1X is used in the unstable regions 31X and 33X, the DSA patterns having regularity are not formed. Even when etching is performed from above the DSA patterns having no regularity, the processing target film 15 is not etched. For this reason, when the guide region 10X is within the stable region 32X, the DSA material 1X becomes a DSA material that is appropriate for the guide region 10X.

Likewise, in the case of using the DSA material 1Y, when the guide size is smaller than a predetermined value (third size), the characteristic 30Y becomes an unstable region 31Y that cannot form DSA patterns having regularity. Distributions of the lipophilic portion 2Y and the hydrophilic portion 3Y in the unstable region 31Y are not illustrated, but have no regularity as in the case of the distributions 51 and 61.

Also, when the guide size is larger than a predetermined value (fourth size), the characteristic 30Y becomes an unstable region 33Y that cannot form DSA patterns having regularity. Distributions of the lipophilic portion 2Y and the hydrophilic portion 3Y in the unstable region 33Y are not illustrated, but have no regularity as in the case of the distributions 53 and 63.

On the other hand, when the guide size is in a predetermined range (from the third size to the fourth size), the characteristic 30Y becomes a stable region 32Y that cannot stably form DSA patterns. The lipophilic portion 2Y and the hydrophilic portion 3Y in the stable region 32Y distributed inside the guide pattern 5 are not illustrated, but are phase-separated as in the case of the distributions 52 and 62. The lipophilic portion 2Y, which is to be the DSA pattern, is disposed up to the bottom.

Therefore, since the DSA material 1Y is used in the stable region 32Y, the DSA patterns having regularity can be stably formed. By performing etching from above the DSA patterns having regularity, the second on-substrate pattern 20Y can be formed. Also, since the DSA material 1Y is used in the unstable regions 31Y and 33Y, the DSA patterns having regularity are not formed. Even when etching is performed from above the DSA patterns having no regularity, the processing target film 15 is not etched. For this reason, when the guide region 10Y is within the stable region 32Y, the DSA material 1Y becomes a DSA material that is appropriate for the guide region 10Y.

When the stable region 32X of the DSA material 1X does not overlap the stable region 32Y of the DSA material 1Y, the DSA material 1X may be used in any region within the stable region 32X, and the DSA material 1Y may be used in any region within the stable region 32Y.

Also, although the case of first forming the first on-substrate pattern 20X and then forming the second on-substrate pattern 20Y has been described in FIG. 6, the second on-substrate pattern 20Y may be first formed and the first on-substrate pattern 20X may be then formed.

Figure 7:
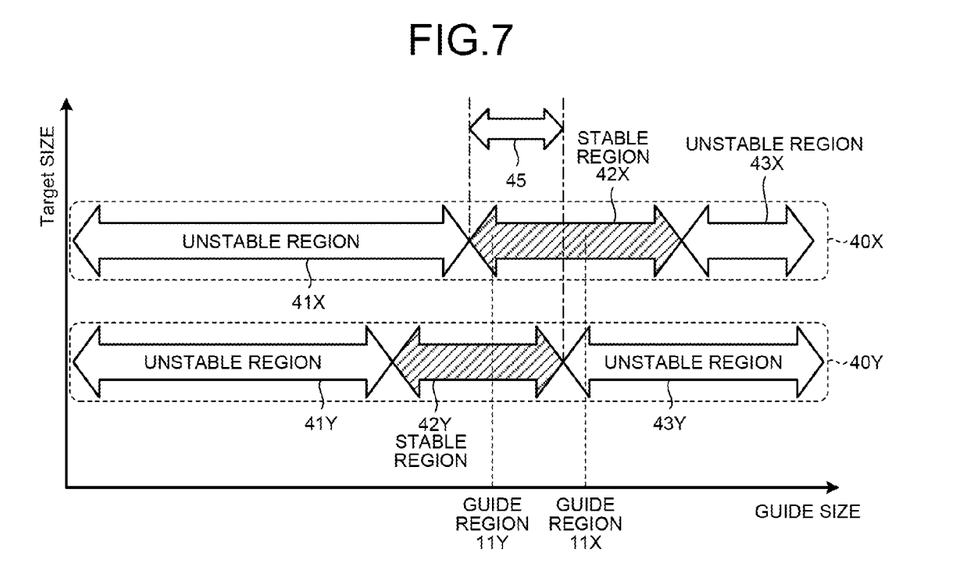
FIG. 7 is a diagram for describing conditions that are applicable as DSA conditions when stable regions are overlapped.

Next, conditions that are applicable as the DSA conditions when the stable regions are overlapped will be described. FIG. 7 is a diagram for describing conditions that are applicable as DSA conditions when the stable regions are overlapped. In FIG. 7, a horizontal axis is a guide size, and a vertical axis is a target size.

FIG. 7 illustrates a case where a characteristic of a DSA material 1P (not illustrated) is a characteristic 40X, and a characteristic of a DSA material 1Q (not illustrated) is a characteristic 40Y. The characteristics 40X and 40Y represent whether or not the DSA patterns can be stably formed with respect to the guide sizes.

In the case of using the DSA material 1P, when the guide size is smaller than a predetermined value (fifth size), the characteristic 40X becomes an unstable region 41X that cannot stably form DSA patterns. Also, when the guide size is larger than a predetermined value (sixth size), the characteristic 40X becomes an unstable region 43X that cannot form stable DSA patterns.

On the other hand, when the guide size is in a predetermined range (from the fifth size to the sixth size), the characteristic 40X becomes a stable region 42X that can stably form DSA patterns having regularity.

Likewise, in the case of using the DSA material 1Q, when the guide size is smaller than a predetermined value (seventh size), the characteristic 40Y becomes an unstable region 41Y that cannot form DSA patterns having regularity. Also, when the guide size is larger than a predetermined value (eighth size), the characteristic 40Y becomes an unstable region 43Y that cannot form DSA patterns having regularity.

On the other hand, when the guide size is in a predetermined range (from the seventh size to the eighth size), the characteristic 40Y becomes a stable region 42Y that can stably form DSA patterns.

However, as illustrated in FIG. 7, the stable region 42X of the DSA material 1P and the stable region 42Y of the DSA material 1Q are overlapped in a partial region (overlap region 45). For this reason, if the DSA material 1P is used in the overlap region 45 of the stable regions 42X and 42Y, the DSA patterns are formed on both of the guide regions 11X and 11Y. Likewise, when the DSA material 1Q is used in the overlap region 45 of the stable regions 42X and 42Y, the DSA patterns are formed on both of the guide regions 11X and 11Y.

For this reason, in the embodiment, the DSA materials 1P and 1Q are not used in the overlap region 45. Therefore, the DSA patterns are formed using the DSA material 11P in the regions excluding the overlap region 45 from the stable region 42X. Likewise, the DSA patterns are formed using the DSA material 1Q in the regions excluding the overlap region 45 from the stable region 42Y.

Also, in the case of forming an isolated hole turn as the DSA pattern, the overlap region 45 may be used. For example, when the on-substrate pattern having a small size is formed in the guide region 11Y having a small size among the guide regions, the on-substrate pattern may be formed using the overlap region 45. Even in this case, when the on-substrate pattern having a larger size is formed in the guide region 11Y having a large size among the guide regions, the overlap region 45 is not used.

For example, the DSA pattern having regularity is first formed from the small guide region 11Y. In this case, when the overlap region 45 is used, the small on-substrate patterns are formed on both of the guide region 11Y and the guide region 11X. Subsequently, the DSA pattern having regularity and the large on-substrate pattern are formed in the larger guide region 11X. As described above, since the small on-substrate pattern is first formed, the size of the large on-substrate pattern is not affected even when the stable region 42Y is used.

Also, in the embodiment, although the case where the two types of the DSA patterns are formed using the two types of the DSA conditions has been described, N types of DSA patterns may be formed using N types of DSA conditions (N is a natural number greater than or equal to 3). For example, when three types of DSA patterns are formed using three types of DSA materials, stable regions of the respective DSA materials are set not to be overlapped with one another.

Figure 8:
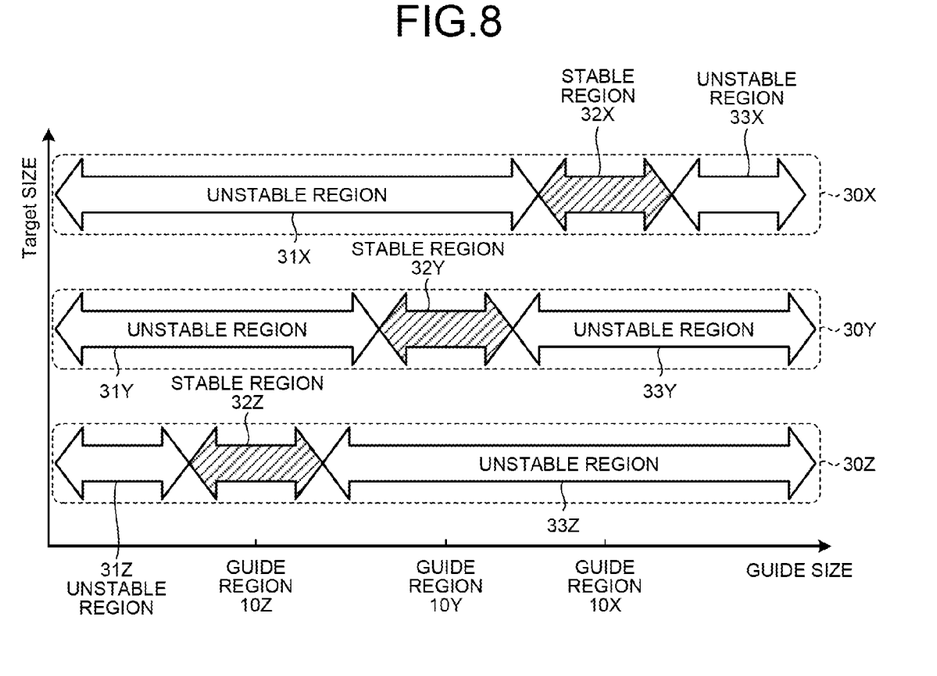
FIG. 8 is a diagram for describing conditions that are applicable as DSA conditions when the DSA conditions are three types.

FIG. 8 is a diagram for describing conditions that are applicable as DSA conditions when the DSA conditions are three types. In FIG. 8, a horizontal axis is a guide size, and a vertical axis is a target size. FIG. 8 illustrates a case where characteristics of DSA materials 1X to 1Z are characteristics 30X to 30Z, respectively. The characteristics 30X and 30Y are the same as the characteristics 30X and 30Y illustrated in FIG. 6. Also, the characteristic 30Z represents whether or not the DSA patterns can be stably formed with respect to the guide region 10Z (not illustrated).

In the case of using the DSA material 1Z (not illustrated), when the guide size is smaller than a predetermined value (ninth size), the characteristic 30Z becomes an unstable region 31Z that cannot form DSA patterns having regularity. Also, when the guide size is larger than a predetermined value (tenth size), the characteristic 30Z becomes an unstable region 33Z that cannot form DSA patterns having regularity.

On the other hand, when the guide size is in a predetermined range (from the ninth size to the tenth size), the characteristic 30Z becomes a stable region 32Z that can stably form DSA patterns.

Therefore, since the DSA material 1Z is used in the stable region 32Z, the DSA patterns having regularity can be stably formed. By performing etching from above the DSA patterns having regularity, a third on-substrate pattern 20Z (not illustrated) can be formed. Also, since the DSA material 1Z is used in the unstable regions 31Z and 33Z, the DSA patterns having regularity are not formed. Even when etching is performed from above the DSA patterns having no regularity, the processing target film 15 is not etched. For this reason, if the guide region 10Z is within the stable region 32Z, the DSA material 1Z becomes a DSA material that is appropriate for the guide region 10Z.

If the stable region 32X of the DSA material 1X overlaps neither of the stable regions 32Y and 32Z of the DSA materials 1Y and 1Z, the DSA material 1X may be used in any region within the stable region 32X.

Likewise, if the stable region 32Y of the DSA material 1Y overlaps neither of the stable regions 32X and 32Z of the DSA materials 1Y and 1Z, the DSA material 1Y may be used in any region within the stable region 32Y.

Likewise, if the stable region 32Z of the DSA material 1Z overlaps neither of the stable regions 32X and 32Y of the DSA materials 1X and 1Y, the DSA material 1Z may be used in any region within the stable region 32Z.

Also, in the case of forming an isolated hole turn as the DSA pattern, the overlap region between the stable regions may be used even when N types of DSA patterns are formed using N types of DSA conditions. Even in this case, the on-substrate pattern is first formed from the small guide region, and the on-substrate pattern is then formed in the large guide region.

After a plurality of types of on-substrate patterns are formed and the guide pattern 5 is removed, for example, a new processing target film is formed on the upper layers of the on-substrate patterns. Subsequently, an on-substrate pattern is formed on the new processing target film.

When manufacturing a semiconductor device (semiconductor integrated circuit), the formation of the on-substrate patterns corresponding to DSA patterns having different sizes, shapes or pitches, the formation of the on-substrate patterns using lithography, and the like are repeated at each layer of the wafer process. For example, when forming the on-substrate patterns using lithography, a wafer 16, on which a resist is coated, is exposed using a mask, and resist patterns are then formed on the wafer 16 by developing the wafer 16. The lower layer sides of the resist patterns are etched using the resist patterns as a mask. Therefore, the on-substrate patterns corresponding to the resist patterns are formed on the wafer 16.

Also, in the embodiment, although the case where the guide region has the line shape or the hole shape has been described, the guide region may have any shape.

According to these embodiments, the on-substrate patterns corresponding to the DSA patterns having different sizes, shapes or pitches can be formed with a small number of processes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for forming a pattern, comprising:
    forming a first guide pattern and a second guide pattern for induced self organization of a DSA material on a processing target film above a substrate;
    forming a first phase-separated pattern at a position corresponding to the first guide pattern on a first DSA condition that is capable of forming the first phase-separated pattern having regularity with respect to the first guide pattern and is incapable of forming a second phase-separated pattern having regularity with respect to the second guide pattern;
    forming a first on-substrate pattern by processing the processing target film, which is disposed in a lower layer side of the first phase-separated pattern, by using the first phase-separated pattern;
    forming the second phase-separated pattern at a position corresponding to the second guide pattern on a second DSA condition that is capable of forming the second phase-separated pattern having regularity with respect to the second guide pattern and is incapable of forming the first phase-separated pattern having regularity with respect to the first guide pattern; and
    forming a second on-substrate pattern by processing the processing target film, which is disposed in a lower layer side of the second phase-separated pattern, by using the second phase-separated pattern.

2. The method according to claim 1, wherein the first phase-separated pattern and the second phase-separated pattern are different in at least one of size, shape, and pitch of the patterns.

3. The method according to claim 1, wherein the first DSA condition and the second DSA condition are different in at least one of a type of the DSA material, a molecular weight of the DSA material, a composition ratio of the DSA material, a type of a lipophilic portion, a type of a hydrophilic portion, $\chi$ parameter of the DSA material, a coating condition of the DSA material, a type of a solvent used when coating the DSA material, a guide condition, an annealing condition of the DSA material, a type of homopolymer to be added to the DSA material, a molecular weight of the homopolymer to be added to the DSA material, and a ratio of segment lengths between the lipophilic portion and the hydrophilic portion.

4. The method according to claim 3, wherein the guide condition comprises at least one of sizes, heights, and taper angles of the first guide pattern and the second guide pattern.

5. The method according to claim 3, wherein the annealing condition of the DSA material comprises at least one of annealing time, annealing temperature and atmosphere until the DSA material is phase-separated.

6. The method according to claim 1, wherein when forming the first phase-separated pattern,
    a solution containing the DSA material is coated from above the first and second guide patterns,
    the solution is buried in a region where the first phase-separated pattern is to be formed,
    a phase separation of the DSA material is performed, and
    the first phase-separation pattern is formed by leaving a first phase-separated phase and removing a second phase-separated phase.

7. The method according to claim 1, wherein when forming the second phase-separated pattern,
    a solution containing the DSA material is coated from above the first and second guide patterns,
    the solution is buried in a region where the second phase-separated pattern is to be formed,
    a phase separation of the DSA material is performed, and
    the second phase-separation pattern is formed by leaving a second phase-separated phase and removing a first phase-separated phase.

8. A method for forming a pattern, comprising:
    forming a first guide pattern and a second guide pattern for induced self organization of a DSA material on a processing target film above a substrate;
    forming first phase-separated patterns at positions corresponding to the first and second guide patterns on a first DSA condition that is capable of forming the first phase-separated patterns having regularity with respect to the first and second guide patterns;
    forming a first isolated hole pattern by processing the processing target film, which is disposed in a lower layer side of the first phase-separated patterns, by using the first phase-separated patterns;
    forming a second phase-separated pattern at a position corresponding to the second guide pattern on a second DSA condition that is capable of forming the second phase-separated pattern having regularity with respect to the second guide pattern and having a size larger than the first phase-separated pattern and is incapable of forming a phase-separated pattern having regularity with respect to the first guide pattern; and
    forming a second isolated hole pattern having a size larger than the first isolated hole pattern by processing the processing target film, which is disposed in a lower layer side of the second phase-separated pattern, by using the second phase-separated pattern.

9. The method according to claim 8, wherein the first phase-separated pattern and the second phase-separated pattern have different pattern sizes.

10. The method according to claim 8, wherein the first DSA condition and the second DSA condition are different in at least one of a type of the DSA material, a molecular weight of the DSA material, a composition ratio of the DSA material, a type of a lipophilic portion, a type of a hydrophilic portion, $\chi$ parameter of the DSA material, a coating condition of the DSA material, a type of a solvent used when coating the DSA material, a guide condition, an annealing condition of the DSA material, a type of homopolymer added to the DSA material, a molecular weight of the homopolymer added to the DSA material, and a ratio of segment lengths between the lipophilic portion and the hydrophilic portion.

11. The method according to claim 10, wherein the guide condition comprises at least one of size and film thickness of the first guide pattern and the second guide pattern.

12. The method according to claim 10, wherein the annealing condition of the DSA material comprises at least one of annealing time and annealing temperature until the DSA material is phase-separated.

13. The method according to claim 8, wherein when forming the first phase-separated pattern,
   a solution containing the DSA material is coated from above the first and second guide patterns,
   the solution is buried in a region where the first phase-separated pattern is to be formed,
   a phase separation of the DSA material is performed, and
   the first phase-separation pattern is formed by leaving a first phase-separated phase and removing a second phase-separated phase.

14. A method for manufacturing a semiconductor device, comprising:
   forming a first guide pattern and a second guide pattern for induced self organization of a DSA material on a processing target film above a substrate;
   forming a first phase-separated pattern at a position corresponding to the first guide pattern on a first DSA condition that is capable of forming the first phase-separated pattern having regularity with respect to the first guide pattern and is incapable of forming a second phase-separated pattern having regularity with respect to the second guide pattern;
   forming a first on-substrate pattern by processing the processing target film, which is disposed in a lower layer side of the first phase-separated pattern, by using the first phase-separated pattern;
   forming a second phase-separated pattern at a position corresponding to the second guide pattern on a second DSA condition that is capable of forming the second phase-separated pattern having regularity with respect to the second guide pattern and is incapable of forming the first phase-separated pattern having regularity with respect to the first guide pattern; and
   forming a second on-substrate pattern by processing the processing target film, which is disposed in a lower layer side of the second phase-separated pattern, by using the second phase-separated pattern.

15. The method according to claim 14, wherein the first phase-separated pattern and the second phase-separated pattern are different in at least one of size, shape, and pitch of the patterns.

16. The method according to claim 14, wherein the first DSA condition and the second DSA condition are different in at least one of a type of the DSA material, a molecular weight of the DSA material, a composition ratio of the DSA material, a type of a lipophilic portion, a type of a hydrophilic portion, $\chi$ parameter of the DSA material, a coating condition of the DSA material, a type of a solvent used when coating the DSA material, a guide condition, an annealing condition of the DSA material, a type of homopolymer added to the DSA material, a molecular weight of the homopolymer added to the DSA material, and a ratio of segment lengths between the lipophilic portion and the hydrophilic portion.

17. The method according to claim 16, wherein the first phase-separated pattern and the second phase-separated pattern are different in at least one of size and film thickness of the first guide pattern and the second guide pattern.

18. The method according to claim 16, wherein the annealing condition of the DSA material comprises at least one of annealing time and annealing temperature until the DSA material is phase-separated.

19. The method according to claim 14, wherein when forming the first phase-separated pattern,
   a solution containing the DSA material is coated from above the first and second guide patterns,
   the solution is buried in a region where the first phase-separated pattern is to be formed,
   a phase separation of the DSA material is performed, and
   the first phase-separation pattern is formed by leaving a first phase-separated phase and removing a second phase-separated phase.

20. The method according to claim 14, wherein when forming the second phase-separated pattern,
   a solution containing the DSA material is coated from above the first and second guide patterns,
   the solution is buried in a region where the second phase-separated pattern is to be formed,
   a phase separation of the DSA material is performed, and
   the second phase-separation pattern is formed by leaving a second phase-separated phase and removing a first phase-separated phase.

* * * * *